United States Patent
Maalouf et al.

(10) Patent No.: US 9,939,483 B2
(45) Date of Patent: Apr. 10, 2018

(54) CONNECTOR MATING ASSURANCE SYSTEM AND METHOD

(71) Applicant: TYCO ELECTRONICS CORPORATION, Berwyn, PA (US)

(72) Inventors: Khalil John Maalouf, Chambersburg, PA (US); Abraham L. Shocket, Cary, NC (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 237 days.

(21) Appl. No.: 14/877,616

(22) Filed: Oct. 7, 2015

(65) Prior Publication Data

US 2017/0102424 A1    Apr. 13, 2017

(51) Int. Cl.
| | |
|---|---|
| G08B 21/00 | (2006.01) |
| G01R 31/04 | (2006.01) |
| H01R 13/502 | (2006.01) |
| H01R 13/641 | (2006.01) |

(52) U.S. Cl.
CPC ......... *G01R 31/045* (2013.01); *H01R 13/502* (2013.01); *H01R 13/641* (2013.01)

(58) Field of Classification Search
CPC .. G01R 31/045; H01R 13/502; H01R 13/641; H01R 43/26
USPC ........................................................ 340/687
See application file for complete search history.

(56) References Cited

U.S. PATENT DOCUMENTS

| | | | |
|---|---|---|---|
| 8,186,216 B2 | 5/2012 | Ogawa et al. | |
| 8,981,961 B2 | 3/2015 | Benner et al. | |
| 9,491,557 B2* | 11/2016 | Fry | H01R 13/641 |
| 2007/0008152 A1 | 1/2007 | Parias | |
| 2009/0310795 A1 | 12/2009 | Apsey et al. | |
| 2010/0242599 A1 | 9/2010 | Ogawa et al. | |
| 2014/0203945 A1* | 7/2014 | Benner | H01R 13/641 |
| | | | 340/687 |
| 2015/0098574 A1 | 4/2015 | Fry et al. | |

FOREIGN PATENT DOCUMENTS

| | | |
|---|---|---|
| DE | 10308403 A1 | 9/2004 |
| EP | 2161796 A1 | 10/2010 |
| JP | 03297080 A | 12/1991 |
| JP | 07185952 A | 12/1991 |
| JP | H04370673 A | 12/1992 |

(Continued)

OTHER PUBLICATIONS

International Search Report, International Application No. PCT/US2016/050672, International Filing Date, Sep. 8, 2016.

(Continued)

*Primary Examiner* — John A Tweel, Jr.

(57) ABSTRACT

A connector mating assurance system includes a user-worn sensor unit configured to be worn on or near a user's hand. The sensor unit has an audible sensor configured to be located in a vicinity of a mating zone for electrical connectors. The audible sensor is configured to detect an audible sound when the electrical connectors are mated. The system includes a user-worn controller connected to the audible sensor. The controller receives audio signals from the audible sensor, processes the audio signals to determine a connector mating status, and provides feedback to the user relating to the connector mating status.

20 Claims, 2 Drawing Sheets

(56) References Cited

FOREIGN PATENT DOCUMENTS

| | | |
|---|---|---|
| JP | 2006-221971 A | 8/2006 |
| JP | 2007-004073 A | 1/2007 |
| JP | 2008-226506 A | 9/2008 |

OTHER PUBLICATIONS

International Search Report, International Application No. PCT/US2014/057085, International Filing Date, Sep. 24, 2014.
Fujitsu Laboratories Ltd., "Fujitsu Develops Glove-Style Wearable Device"; Touch-and gesture-based input supports field work, Feb. 18, 2014, 4 pgs.

\* cited by examiner

CONNECTOR MATING ASSURANCE SYSTEM AND METHOD

BACKGROUND OF THE INVENTION

The subject matter herein relates generally to connector mating assurance systems and methods.

Ensuring that mating pairs of electrical connectors are mated properly is important in electrical systems, particularly in electrical systems that exhibit vibration during operation, such as in automotive applications. For example, an electrical connector can be partially mated during a car assembly process, such as in a car assembly factory, and can pass conventional electrical assurance tests, such as tests that pass electrical signals through the electrical connectors to determine electrical connection of the connectors. However, once in operation, the car vibration can cause the electrical connectors to come loose and cause failure.

Conventional assembly methods for electrical connectors provide a mating mechanism, such as a latch, that produces a click when the latch latches in place. However, in an assembly situation, a worker may not properly hear the click due to background factory noises, or could confuse the click with other sounds that closely resemble a connector click. Some known systems use a double casing of the connector, where a second case only fits if the electrical connectors were properly mated. However, such systems have increased cost associated with the second case and increased labor time to assemble.

A need remains for a connector mating assurance system and method to detect proper mating of electrical connectors.

BRIEF DESCRIPTION OF THE INVENTION

In one embodiment, a connector mating assurance system is provided including a user-worn sensor unit configured to be worn on or near a user's hand. The sensor unit has an audible sensor configured to be located in a vicinity of a mating zone for electrical connectors. The audible sensor is configured to detect an audible sound when the electrical connectors are mated. The system includes a user-worn controller connected to the audible sensor. The controller receives audio signals from the audible sensor, processes the audio signals to determine a connector mating status, and provides feedback to the user relating to the connector mating status.

In another embodiment, a connector mating assurance system is provided including a user-worn sensor unit configured to be worn on or near a user's hand. The sensor unit has an audible sensor configured to be located in a vicinity of a mating zone for electrical connectors. The audible sensor is configured to detect an audible sound when the electrical connectors are mated. The system includes a user-worn controller connected to the audible sensor. The user-worn controller receives audio signals from the audible sensor, processes the audio signals to determine a connector mating status, and provides feedback to the user relating to the connector mating status. The user-worn controller has a communicator configured to transmit RF signals relating to the audio signals. The system includes a host controller remote from the user-worn controller. The host controller receives the RF signals from the communicator of the user-worn controller.

In a further embodiment, a method of detecting electrical connector mating is provided including positioning a user-worn audible sensor on or near a user's hand, positioning the audible sensor in a vicinity of a mating zone for an electrical connector, and detecting an audible sound with the audible sensor when the electrical connectors are mated. The method includes positioning a user-worn controller on the user, sending audio signals based on the audible sound from the audible sensor to the user-worn controller and processing the audio signals at the user-worn controller to determine a connector mating status. The system includes providing feedback to the user based on the connector mating status.

DETAILED DESCRIPTION OF THE INVENTION

Figure 1:
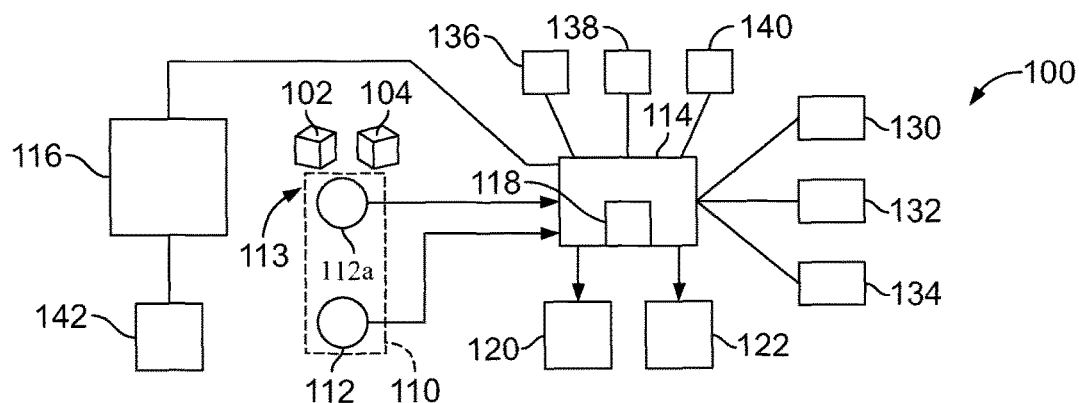
FIG. 1 illustrates a mating assurance system formed in accordance with an exemplary embodiment.

FIG. 1 is a schematic illustration of a mating assurance system 100 formed in accordance with an exemplary embodiment. The mating assurance system 100 monitors connector mating to provide assurance to the user/system that two components, such as electrical connectors 102, 104, are properly mated. The mating assurance system 100 may provide feedback to an assembler to confirm that the components 102, 104 are properly mated. The mating assurance system 100 may provide assurance of mating of other types of components, such as contact to connector housing mating assurance, contact to contact mating assurance, and the like, and is not limited to connector mating assurance. The mating assurance system 100 may be used for assurance of mating of other types of components in other embodiments, such as for latching of parts other than electrical connectors, such as door panels. While the system is described hereafter in reference to assurance of mating of electrical connectors, the subject matter herein is not intended to be limited to such.

In an exemplary embodiment, the mating assurance system 100 detects an audible sound, such as a latching sound or click, when the electrical connectors 102, 104 are mated. The mating assurance system 100 may use real time signal processing for mating assurance. The mating assurance system 100 provides feedback to the assembler that the electrical connectors 102, 104 are properly mated. In an exemplary embodiment, the mating assurance system 100 uses both a user-worn component and a host component, which communicate and transmit signals therebetween, for signal processing. The audible verification aspect of the mating assurance system 100 may be used in conjunction with an electronic verification system or other quality control systems that tests the electrical connection between the electrical connectors 102, 104 as a secondary verification system.

The mating assurance system 100 includes a user-worn sensor unit 110 configured to be worn on or near a user's hand and/or wrist. For example, the sensor unit 110 may be integrated into or be worn on a glove worn by the user. The sensor unit 110 includes at least one sensor 112 that is located in a vicinity of a mating zone 113 for the electrical connectors 102, 104. Optionally, multiple sensors 112 may be used and the sensors 112 may be different types of sensors. In an exemplary embodiment, the sensor unit 110 includes at least one audible sensor, which may be referred to hereinafter as audible sensor 112. Optionally, the audible sensor 112 may be or may include a microphone and may be referred to hereinafter as a microphone 112; however, other types of audible sensors may be used in alternative embodiments, such as any type of audible sensor capable of detecting the audible click made when the electrical connectors 102, 104 are mated. Any number of microphones 112 may be used in various embodiments. The microphone 112 may be an omnidirectional microphone.

Optionally, when multiple microphones 112 are used, the microphones 112 may be positioned at different distances from the mating zone 113, such that the various microphones 112 receive the audible sound at different times (e.g., the second microphone may be positioned further from the electrical connectors 102, 104 such that the audible sound made when the electrical connectors 102, 104 are mated is received at a later time at the second microphone as compared to the first microphone). The mating assurance system 100 may use the time difference in audible detection to determine the relative distances between the microphones 112 and the electrical connectors 102, 104 and/or to determine a direction of sound origination (e.g., the direction of the mating zone 113).

Using multiple microphones 112 may enhance reliability of the sound detection of the mating assurance system 100 as compared to systems that use a single microphone. Using multiple microphones 112 may reduce the probability of false positive identification of connector mating as compared to systems that use a single microphone. Using multiple microphones 112 allows collecting audio signals from different angles to provide enhanced signal signature matching capabilities and/or for determining angular orientation of the electrical connectors 102, 104 when mated. Optionally, the mating zone 113 may be positioned beyond the first microphone 112 such that the first microphone 112 is positioned between the mating zone 113 and the second microphone 112. In other embodiments, the mating zone 113 may be positioned between the first and second microphones 112. The mating zone 113 may be staggered forward of, rearward of, or to one side or the other of the first microphone 112 and/or the second microphone 112.

Optionally, the mating assurance system 100 may identify the presence of the electrical connector 102 and/or the electrical connector 104, such as using a connector identification module. For example, the mating assurance system 100 may identify simply that the electrical connector 102 and/or 104 is present in the assembler's hand or in the mating zone 113. Alternatively or additionally the mating assurance system 100 may identify the particular type of connector that is present, which may be used to assure that such particular electrical connector 102 and/or 104 has been properly mated. By identifying the presence of the electrical connectors 102, 104 the mating assurance system 100 may limit the audible sound processing, which may save power, data processing time and storage requirements, data transmission needs, and the like.

The sensors 112 of the sensor unit 110 may include one or more connector identification sensors, which may be referred to hereinafter as connector identification sensors 112*a*. The connector identification sensors 112*a* are used for detecting and/or identifying the electrical connector 102 and/or 104. The connector identification module may receive signals from the connector identification sensors 112*a* and include hardware and/or software for identifying the type and/or presence of the electrical connector 102 and/or 104.

Optionally, the mating assurance system 100 may be operated based on inputs and outputs of the connector identification module. For example, the mating assurance system 100 may wait to detect audible sounds until after the system determines that the assembler is grasping the electrical connector 102, 104 and/or until after the system determines that the electrical connector 102, 104 is in the mating zone 113. As such, the amount of data processing for audible detection may be reduced, which may reduce the number of false detections and/or conserve power, data storage, processor requirements and the like. Optionally, multiple connector identification sensors 112 may be used. Various types of connector identification sensors 112 may be used depending on the types of electrical connectors 102, 104, the environment the mating assurance system 100 is being used, the sophistication of the mating assurance system 100, the implement housing or holding the connector identification sensor 112*a*, and the like.

The connector identification sensor 112*a* may be a momentary switch that determines the moment(s) that the electrical connector 102, 104 is held by the assembler. The connector identification sensor 112*a* may be another type of touch based sensor. For example, the connector identification sensor 112*a* may be a capacitive sensor. The connector identification sensor 112*a* may be another type of sensor, such as a proximity sensor, such as an inductive sensor, a radio frequency identification (RFID) sensor, a barcode reader, or another type of sensor.

The mating assurance system 100 includes a user-worn controller 114 configured to be worn by the user and a host controller 116 remote from the user-worn controller 114. The user-worn controller 114 is configured to communicate with the host controller 116, such as wirelessly. For example, the user-worn controller 114 includes a communicator 118 configured to transmit and/or receive RF signals or other types of wireless signals between the user-worn controller 114 and the host controller 116.

The sensor(s) 112 are connected to the user-worn controller 114. The controller 114 receives audio signals from the microphone 112 and receives connector identification signals from the connector identification sensor 112*a*. The sensor(s) 112 may be connected to the controller 114 by wired or wireless connections. Optionally, the sensors 112 may be plugged into a corresponding sensor input of the controller 114 and the sensors 112 may be replaceable or user configurable. For example, different types of sensors may be plugged into the controller 114 to change the operation of the system, to update the system, to replace worn or damaged sensors, and the like. The controller 114 is configured to process inputs from the sensor(s) that are connected thereto and the controller 114 may be updated and/or configurable based on the sensor(s) connected thereto. The controller 114 can include or represent hardware circuitry that includes and/or is connected with one or more processors (e.g., microprocessors, integrated circuits, application specific integrated circuits, field programmable gate arrays, or other electronic logic-based devices) that operate to perform one or more, or all, of the operations described herein.

The controller 114 processes the audio signals and/or the connector identification signals for mating assurance. The controller 114 may provide feedback to the assembler based on the connector identification signals and/or the audio signals. The controller 114 may process the connector identification signals separate from the audio signals. The controller 114 may process the connector identification signals and/or the audio signals by transmitting the connector identification signals and/or the audio signals to another controller or processing unit, such as the host controller 116.

The controller 114 may process the signals by at least one of analyzing the signals, comparing the signals, determining a connector mating status (e.g., mated versus not mated) based on the signals, and the like, to generate processed signals. The controller 114 may send the processed signals and/or the original connector identification signals and/or the original audio signals to the host controller 116. The host controller 116 may at least one of further process the signals, validate the signals, store the signals, and the like. Additionally, signals or data may be transmitted from the host controller 116 to the user-worn controller 114. Optionally, the controller 114 may process the signals by transmitting all of the signals to the host controller 116 without analyzing or changing the signals. The host controller 116 may then process the signals, such as by analyzing the signals and/or determining a connector mating status, and then the host controller 116 may transmit the connector mating status back to the user-worn controller 114 to provide feedback to the user.

In an exemplary embodiment, the controller 114 identifies the presence of the electrical connectors 102, 104 based on the connector identification signals from the connector identification sensor(s) 112. The controller 114 may identify the presence of the electrical connectors 102, 104 by determining when the connector identification sensor 112a is in the vicinity of the electrical connectors 102, 104 and/or when the connector identification sensor 112a touches the electrical connectors 102, 104 based on the connector identification signals. The controller 114 may identify the presence of the electrical connectors 102, 104 by determining the type of electrical connectors 102, 104, such as through proximity sensing, capacitive sensing, inductive sensing, RFID reading, barcode reading or by other processes. Optionally, the controller 114 may not begin audio signal processing until after the controller 114 positively identifies the presence of the electrical connectors 102, 104 (for example, after the controller 114 determines that the assembler is grasping the electrical connectors 102, 104). As such, battery power, processing power, memory, and the like of the controller 114 or other components of the mating assurance system 100 may be preserved.

The controller 114 determines if the electrical connectors 102, 104 are properly mated based on the audio signals as a form of audible verification of proper mating. In an exemplary embodiment, the controller 114 compares the audio signals from the microphone 112 to templates or characteristic signatures for mating assurance. When multiple microphones 112 are used, the controller 114 may compare the time of receipt of the audio signals from the microphones 112 during processing.

The controller 114 determines or verifies if the audible sound received at the microphone 112 originated from mating of the electrical connectors 102, 104 and/or filters out the audio signals if it is determined that the audible sound was from a source other than the mating of the electrical connectors 102, 104. For example, the controller 114 may filter background noise if the filter determines that the audible sound was from a source other than the mating of the electrical connectors 102, 104, which may enhance the audible sound for the assembler. For example, by using multiple microphones 112, the controller 114 may determine the direction of origin of the audible sound and may filter out audible sounds that are determined to occur from a direction outside of the mating zone 113, such as from a direction behind the second microphone 112 or from a direction too remote from the mating zone 113 to be occurring from the mating of the electrical connectors 102, 104. The mating assurance system 100 may include other microphones in or around the mating zone 113 that listen for background noise and the controller 114 may compare the audio signals from each of the microphones to isolate the audible sounds associated with mating the electrical connectors 102, 104 from the background noise. The controller 114 may have other means of filtering the background noise detected by the microphones.

In an exemplary embodiment, the microphone 112 may be held by the assembler proximate to the assembler's hand. For example, the microphone 112 may be part of a wearable electronic, such as part of a strap, band or clip held on the assembler's hand or integrated as part of a glove worn by the assembler. In one particular embodiment, the microphone 112 may be worn by the assembler at or near the assembler's fingers, at or near the assembler's wrist, or otherwise and thus may be positioned at or near the mating zone 113 near enough to the electrical connectors 102, 104 to detect the audible sounds of mating. Optionally, the microphone 112 may physically engage the electrical connectors 102, 104 such that the latching sound is transmitted through the structure of the electrical connectors 102, 104 directly into the microphone 112. In other embodiments, rather than being worn by the assembler, the microphone 112 may be fixed or mounted in a particular location within the mating zone 113 in the vicinity where the assembler is mating the electrical connectors 102, 104.

In an exemplary embodiment, the mating assurance system 100 may be adapted for use in an area where visibility of and accessibility to the mating zone 113 is limited. For example, the electrical connectors 102, 104 may be part of wire harnesses that are assembled and mated during assembly of a car in an automotive plant. The electrical connectors 102, 104 may be mated in an area under the hood, behind the engine, behind the dashboard, under a seat, or in other difficult to see areas, making use of the audible clicking sound when the electrical connectors 102, 104 are mated. The mating assurance system 100 enhances the audible sound providing various types of feedback to the assembler to ensure that the electrical connectors 102, 104 are properly mated. Additionally, the mating of the electrical connectors 102, 104 may occur in a noisy environment, such as in an assembly plant, manufacturing plant or elsewhere where the audible click made when the latching of the electrical connectors 102, 104 may be unheard by the assembler. Optionally, one of the connectors, such as the electrical connector 104 may be integrated into another component, such as a header or electronic module that is permanently mounted into the vehicle and thus is not movable by the assembler. In such cases, only the other electrical connector 102 is grasped by the user and mated to the permanent electrical connector 104.

Figure 2:
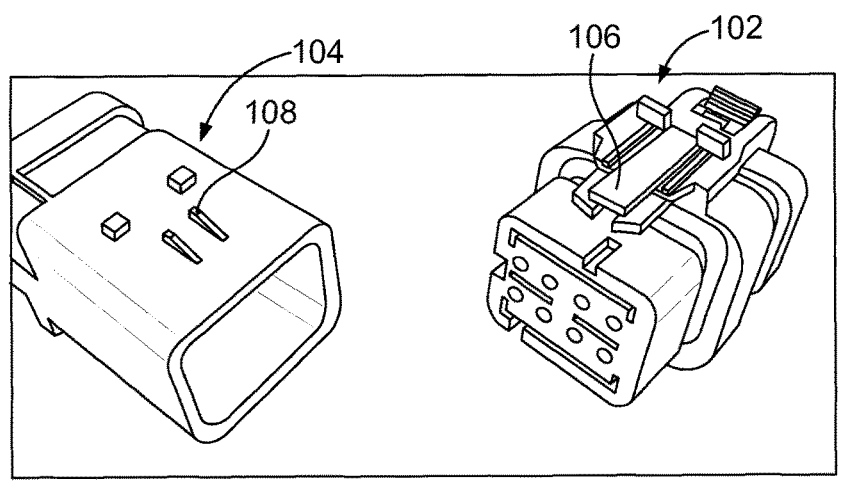
FIGS. 2 and 3 illustrate exemplary embodiments of different types of electrical connectors.
Figure 3:
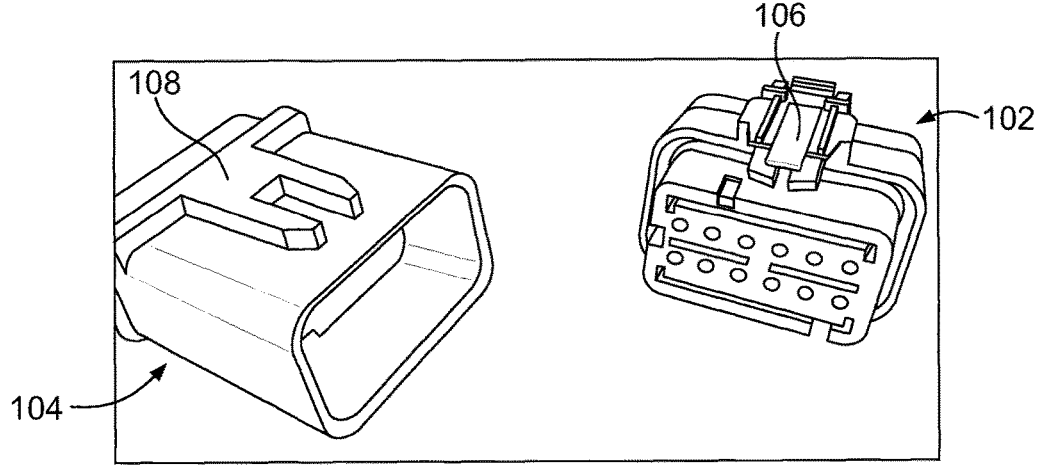

The electrical connectors 102, 104 may be any type of electrical connectors. In an exemplary embodiment, the mating assurance system 100 may be used during assembly of automotive electrical connectors. The electrical connectors 102, 104 may be sealed or unsealed automotive connectors; however are not intended to be limited to such. FIGS. 2 and 3 illustrate exemplary embodiments of different types of electrical connectors 102, 104. For example, FIG. 2 illustrates an eight position connector and an eight position receptacle configured to have eight contacts and associated wires extending therefrom. The electrical connectors 102, 104 illustrated in FIG. 3 are twelve position connector and receptacle connectors configured to have twelve contacts and associated wires. Other types of electrical connectors 102, 104 may be provided in alternative embodiments, such as two position connectors, four position connectors, six position connectors, ten position connectors, fourteen position connectors, and the like. Other types of electrical connectors 102, 104 other than rectangular connectors, such as circular connectors, may be provided in other alternative embodiments. The electrical connectors 102 and/or 104 may be board mounted connectors rather than being cable or wire connectors, such as a connector that is integrated or coupled to equipment or components within the vehicle. The connectors may have different types or sized latches having different audible characteristics during latching.

The mating assurance system 100 may be used for connector identification purposes, such as to identify latching of the eight position connectors as compared to the twelve position connectors (or other types of connectors). The mating assurance system 100 may be used to identify the mating orientation of the electrical connectors 102, 104, such as to determine if the electrical connectors 102, 104 are top-up, bottom-up, side-up and the like as the audible characteristics of the latching sound or click may be different based on the orientation of the electrical connectors 102, 104. Additionally, the connector identification sensor 112a may be used to determine the orientation of the electrical connectors 102, 104. The mating assurance system 100 may have different templates for the various orientations for enhanced signal processing.

The electrical connectors 102 include a deflectable latch 106 and the receptacle electrical connectors 104 include a catch 108 for the latch 106, or vice versa. Optionally, the latch 106 of the twelve position connector (FIG. 3) may be different than the latch 106 of the eight position electrical connector 102 (FIG. 2). For example, the latches 106 may have different lengths, may be made of different materials, may have different shapes, and the like. The catches 108 may have different sizes, shapes, number of teeth, and the like. The different latches 106 and/or catches 108 have different audio signatures when latching to the corresponding catches 108. For example, when the latch 106 engages the catch 108 an audible click may be made, such as when the latch 106 snaps down into position behind the catch 108 (or multiple clicks may be heard when multiple teeth are provided). The latch 106 and/or catch 108 may be designed to have prominent audio signatures. Providing different latches 106 and/or catches 108 provides different audio signatures when the electrical connectors 102, 104 are mated. The mating assurance system 100 may be configured to differentiate between the different audio signatures of the different types of electrical connectors 102, 104 to identify the particular electrical connectors 102, 104 that are mated. Additionally, the audible sound produced when the latches 106 engage the corresponding catches 108 may have different audible characteristics depending on the orientation of the latches 106 or catches 108 relative to the microphones 112 (e.g., on the top surface facing the microphones versus on the bottom with the assemblers hand between the microphones and the latches/catches). The mating assurance system 100 may be able to differentiate when the electrical connectors 102, 104 are in different orientations.

The connector identification sensor 112a may be used to identify and distinguish between the different types of electrical connectors 102, 104 (for example, between the eight position and the twelve position connectors). For example, the connector identification sensor 112a may use capacitive sensing, inductive sensing, RFID sensing, barcode sensing, or other types of sensing to determine the type of electrical connector 102, 104.

Returning to FIG. 1, the connector identification sensor 112a detects the presence of the electrical connectors 102, 104 either in the user's grasp or in the mating zone 113. The connector identification signals are transmitted to the controller 114. The controller 114 processes the connector identification signals and provides an output to another portion of the controller 114, to another controller 114 and/or provides feedback to the assembler. The audible sensor 112 detects the latch click(s) that occurs when the latch 106 is latched, signifying that the electrical connectors 102, 104 are properly mated. The audio signals, including the audio signals corresponding to the latch click, are transmitted to the controller 114. The controller 114 processes the audio signals and provides an output to another portion of the controller 114, to another controller 114 and/or provides feedback to the assembler.

In an exemplary embodiment, the controller 114 provides audible feedback to the assembler based on the audio signals. For example, a speaker 120 may be coupled to the controller 114 and output from the controller 114 may cause the speaker 120 to provide audible feedback. The speaker 120 may be part of headphones or other gear worn on the user's head. The speaker 120 may enhance (e.g., make louder) the click detected by the microphone 112 to make it easier or possible for the assembler to hear. The audible feedback may be based on the connector identification signals, such as a sound when the presence of the electrical connectors 102, 104 is detected. The controller 114 may provide other types of feedback, such as tactile feedback to the user, which may be in the form of vibration.

In an exemplary embodiment, the controller 114 provides visual feedback to the assembler at a display 122 associated with the controller 114. The visual feedback may be based on the connector identification signals, such as a visual indication when the presence of the electrical connectors 102, 104 is detected, visual indication when a positive connector mating status is detected (e.g., when the connectors are mated), visual indication when connector mating assurance is validated by the host controller 116, and the like. The display 122 may include LEDs or may include a display screen. The display may include a user interface to allow the user to interact with the controller 114. The display 122 may be worn by the user. Alternatively, the display 122 may be a stationary monitor, such as a monitor setting on a desk, integrated into a computer or other system, or mounted to a wall, or may be a portable monitor and may communicate with the controller 114 via a wired or wireless connection. The display 122 may be part of the host controller 116 or configured to receive input from the host controller 116. The display 122 may display visual confirmation that proper mating has occurred based on the audio signals processed by the controller 114, such as by displaying a particular color, displaying a particular icon, displaying words and/or symbols, and the like. Other types of feedback may be given, such as haptic feedback. For example, the controller 114 may include or be operably coupled to a vibrator that vibrates to provide feedback to the user.

The controller 114 may determine the type of the electrical connectors 102, 104 mated (e.g., eight position versus twelve position versus another type) and may display information relating to the particular type of electrical connectors 102, 104 that have been mated. For example, during a particular assembly, the assembler may need to mate a four position connector, an eight position connector and a twelve position connector. After the assembler performs the mating, the assembler may refer to the display 122 to verify that all three connectors were mated. The display 122 may indicate that only two of the connectors were actually mated, causing the assembler to return to the vehicle and figure out which connector was not properly mated. Alternatively, the controller 114 may identify which of the connectors were mated based on the audio signals and indicate on the display 122 which of the three connectors were properly mated and/or which of the three connectors were not properly mated. The controller 114 may identify which of the connectors were handled by the assembler, such as based on the connector identification signals, and may also identify which of the connectors were properly mated, such as based on the audio signals.

In an exemplary embodiment, the controller 114 may include or be coupled to a template module 130 that includes templates of different types of electrical connectors 102, 104 (e.g., 2 position, 4 position, 6 position, 8 position, 13 position, etc.). Additionally, or alternatively, the host controller 116 may include a template module. The template module 130 may include audio signatures of the various types of electrical connectors 102, 104. The controller 114 compares the audio signals to the audio signatures to determine a connector mating status. For example, a positive connector mating status may be determined when the audio signals closely match the audio signature template. The positive connector mating status corresponds to the audio signals generated when the electrical connectors 102, 104 are properly mated. The connector mating status may be negative or not yet mated prior to positively identifying the positive connector mating status. The template module 130 may include connector identification signatures of the various types of electrical connectors 102, 104, which may include capacitive signatures, inductive signatures, RFID signatures, barcode signatures, or other types of signatures to determine the type of electrical connector 102, 104. The template module 130 may include different orientation templates of signatures of the various electrical connectors 102, 104 at different orientations (e.g., top-up, bottom-up, side-up and the like). Optionally, the templates may be stored on the host controller 116 and transmitted to the user-worn controller 114 when paired or coupled. Alternatively, the templates may be generated by the user-worn controller 114, such as during a calibration operation, and then stored by the user-worn controller 114 and/or the host controller 116.

The controller 114 may compare the received connector identification signal and/or audio signal to the various templates to determine the connector mating status and/or to determine which type of electrical connectors 102, 104 was mated and/or the orientation of the electrical connectors 102, 104 in the mating zone 113 when mated. For example, the template module 130 may have different time domain characteristics and/or frequency domain characteristics for the different types of electrical connectors 102, 104 and/or for the different orientations. The controller 114 may correlate the signals against time domain templates and/or frequency domain templates to determine the connector mating status, to identify the particular type of electrical connectors 102, 104 that are mated and/or to determine the orientation of the electrical connectors 102, 104 during mating. Having different orientation templates allows the system to account for different connector identification characteristics or different audible characteristics of the latching when a particular electrical connector type is mated, which may lead to a false-negative determination in systems that do not include multiple orientation templates.

In an exemplary embodiment, the controller 114 may include or be coupled to a calibration module 132 that is used to calibrate the controller 114 and/or the template module 130. Additionally, or alternatively, the host controller 116 may include a calibration module. In a calibration mode, the electrical connectors 102, 104 may be mated, preferably numerous times and/or in various orientations to increase the amount of data to calibrate the controller 114 and/or template module 130. Time domain characteristics, frequency domain characteristic and/or other characteristics of the audio signal associated with the mating (e.g. the click) detected by the microphone 112 may be recorded and a median or average time domain template, frequency domain template and/or other type of template may be determined for each type of electrical connector 102, 104 (e.g., 2 position, 4 position, 6 position, 8 position, 13 position, etc.) that may be assembled and monitored by the mating assurance system 100. The controller 114 may be calibrated and programmed for use with any number of different types of electrical connectors 102, 104. Based on the unique signatures of the audible sound made when the particular types of electrical connectors 102, 104 are mated and/or when the particular electrical connectors 102, 104 are mated at various orientations, the controller 114 is able to identify and determine exactly which type of electrical connectors 102, 104 have been mated at any particular time. The controller 114 provides feedback at the display 122 for the assembler to identify which types of electrical connectors 102, 104 have been mated.

In an exemplary embodiment, the controller 114 includes a connector identification module 134. Additionally, or alternatively, the host controller 116 may include a connector identification module. The connector identification module 134 receives the connector identification signals from the connector identification sensor 112a. The connector identification module 134 processes the connector identification signals, such as by comparing the connector identification signals to the templates to identify the presence of the electrical connector 102, 104 based on the connector identification signals from the connector identification sensor(s) 112. The connector identification module 134 may identify the presence of the electrical connectors 102, 104 by determining when the connector identification sensor 112a is in the vicinity of the electrical connectors 102, 104 and/or when the connector identification sensor 112a touches the electrical connectors 102, 104 based on the connector identification signals. The connector identification module 134 may identify the presence of the electrical connectors 102, 104 by determining the type of electrical connectors 102, 104, such as through proximity sensing, capacitive sensing, inductive sensing, RFID reading, barcode reading or by other processes. The connector identification module 134 may use the audio signals from the audible sensor 112 to identify the electrical connectors 102, 104.

In an exemplary embodiment, the controller 114 includes an activation module 136. The activation module 136 may activate various components of the mating assurance system 100 and/or may deactivate various components of the mating assurance system 100. For example, the activation module 136 may activate or deactivate (e.g., turn on/off, place in sleep/awake mode, and the like) the various components to conserve battery usage, processing usage, memory usage, and the like. Optionally, the activation module 136 receives the audio signals and/or the connector identification signals form the sensors 112 or from the other modules.

In one particular aspect, when the activation module 136 determines that the electrical connectors 102, 104 are grasped by the user or in the vicinity of the mating zone 113, the activation module 136 may activate the audible sensor 112 and/or a mating assurance module 138 of the controller 114. Optionally, the audible sensor 112 and/or a mating assurance module 138 may be activated for a predetermined period of time after the electrical connector 102, 104 presence is detected. Optionally, the activation module 136 may deactivate the audible sensor 112 and/or a mating assurance module 138 after such predetermined time. As such, the audible processing, data storage, and component usage may be reduced, which may conserve battery usage, memory usage, data processing, and the like.

In another aspect, when the controller 114 determines a positive connector mating status, the activation module 136 may activate the communicator 118 of the controller 114 and transmit data or signals to the host controller 116. Optionally, the communicator 118 may be activated for a predetermined period of time after the positive connector mating status is determined and transmit signals to the host controller 116 for such predetermined time. Optionally, the activation module 136 may deactivate the communicator 118 after such predetermined time. As such, the data processing, component usage and battery usage may be reduced as compared to a system that continuously transmitted between the controllers 114, 116.

The mating assurance module 138 receives the audio signals from the audible sensor 112. The mating assurance module 138 processes the audio signals, such as by comparing the audio signals to the templates to identify the "click" or other sound associated with connector mating. The mating assurance module 138 processes the audio signals and provides an output to another portion of the controller 114, to the host controller 114 and/or provides feedback to the assembler.

The mating assurance module 138 may record data and/or process data over time. The mating assurance module 138 detects events, which may correspond to latching or mating of the connectors. False events may occur when the microphone touches something, when the connectors touch some other component, such as if the connectors are touched together but not mated or if the connectors are dropped, when other noises occur in the assembly facility, such as using other tools or machines around the assembly factory, and the like. The false events may be identified by the mating assurance module 138, such as by analyzing the audio signatures and comparing the audio signatures to the templates and determining a negative connector mating status (e.g., the audio signals do not match any template). The mating assurance module 138 may ignore false event noises. The positive mating events (e.g., click) may be verified by comparing the audio signatures of the recorded data to the templates, such as time domain templates and/or frequency domain templates. When an event is detected, the controller 114 may provide audible, visual or other feedback outputs to the assembler to confirm that the connectors are properly mated.

The processing of the audio signals by the mating assurance module 138 may be performed in real time on the user-worn controller 114. As such, the user may receive feedback quickly. There is no time delay as in transmitting the audio signals to the host controller 116, processing on the host controller 116 and then transmitting the connector mating status back to the user-worn controller 114. Additionally, battery usage of the user-worn controller 114 may be reduced by limiting use of the communicator 118. For example, by processing the audio signals on the user-worn controller 114, all of the audio signals do not need to be transmitted to the host controller 116. The user-worn controller 114 may transmit fewer data (e.g., fewer bits, fewer packets, and the like) than the user-worn controller receives (e.g., from the sensors 112), which reduces the amount of data transmission and may conserve battery power of the user-worn controller 114. For example, less than all of the audio signals may be transmitted to the host controller 116. In one aspect, only the audio signals occurring in time around the identification of the mating may be transmitted. For example, the user-worn controller 114 may transmit the audio signals corresponding to the immediate time vicinity of identification of a positive connector mating status to the host controller 116. The user-worn controller 114 may transmit the audio signals corresponding to a predetermined period of time before the positive connector mating status, the audio signals corresponding to the period of time at the positive connector mating status, and the audio signals corresponding to a predetermined period of time after the positive connector mating status.

Optionally, none of the audio signals may be transmitted to the host controller 116. For example, other signals, such as signals relating to the connector mating status, the presence of the connector, the type of connector and the like may be transmitted to the host controller 116. Other types of signals relating to the audio signals may be transmitted to the host controller 116, such as how loud the audible sound was, how well the audio signal matched the template, and the like.

In an exemplary embodiment, the controller 114 and/or the controller 116 includes or is electrically connected to an electronic verification module 140. The electronic verification module 140 sends signals through the electrical connectors 102, 104 to verify that the electrical connectors 102, 104 are electrically connected. The controller 114 may verify which electrical connectors 102, 104 have affirmatively passed the electronic verification module 140 and compare such list of electrical connectors 102, 104 with the list of electrical connectors 102, 104 that have affirmatively passed audible verification. Data from the controller 114 and/or electronic verification module 140 may be sent to a master quality control database or system on the vehicle or at the assembly plant for review and/or verification of successful assembly of the electrical connectors 102, 104. Such information may be combined with information from other modules or systems.

In an exemplary embodiment, the host controller 116 includes a validation module 142 that validates the connector mating status determined by the user-worn controller 114. The validation module 142 analyzes the RF signals sent from the controller 114 to the host controller 116 to validate the connector mating status. For example, the host controller 116 may include any or all of the modules described above as being associated with the user-worn controller 114, such as a mating assurance module similar to the mating assurance module 138 that analyzes the audio signals transmitted to the host controller 116. Once the signals sent to the host controller 116 are analyzed, the host controller 116 may transmit a validation signal back to the user-worn controller 114. The validation signal may verify the connector mating status or may reject the connector mating status determined by the user-worn controller 114. Optionally, the host controller 116 may perform more or better analysis than the user-worn controller 114 on the audio signals because the host controller 116 may have higher power processors or more time available to process and analyze the audio signals. The user-worn controller 114 may provide high level analysis of the audio signals, which may provide quicker feedback to the user and require less computing power and thus conserve the battery power of the user-worn device.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

It should be noted that the particular arrangement of components (e.g., the number, types, placement, or the like) of the illustrated embodiments may be modified in various alternate embodiments. In various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), a given module or unit may be added, or a given module or unit may be omitted. For example, some or all of the various modules may be integrated with the controller 114. For example, components of the various modules and the controller 114 may be implemented on one or more circuit boards and/or may be housed within a common housing. The various modules may have inputs and/or outputs that are transmitted to other modules and/or to the controller 114.

It should be noted that the various embodiments may be implemented in hardware, software or a combination thereof. The various embodiments and/or components, for example, the units, modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optical drive, and the like. The storage device may also be other similar means for loading computer programs or other instructions into the computer or processor.

As used herein, the term "computer" and "controller" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "controller" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

Figure 4:
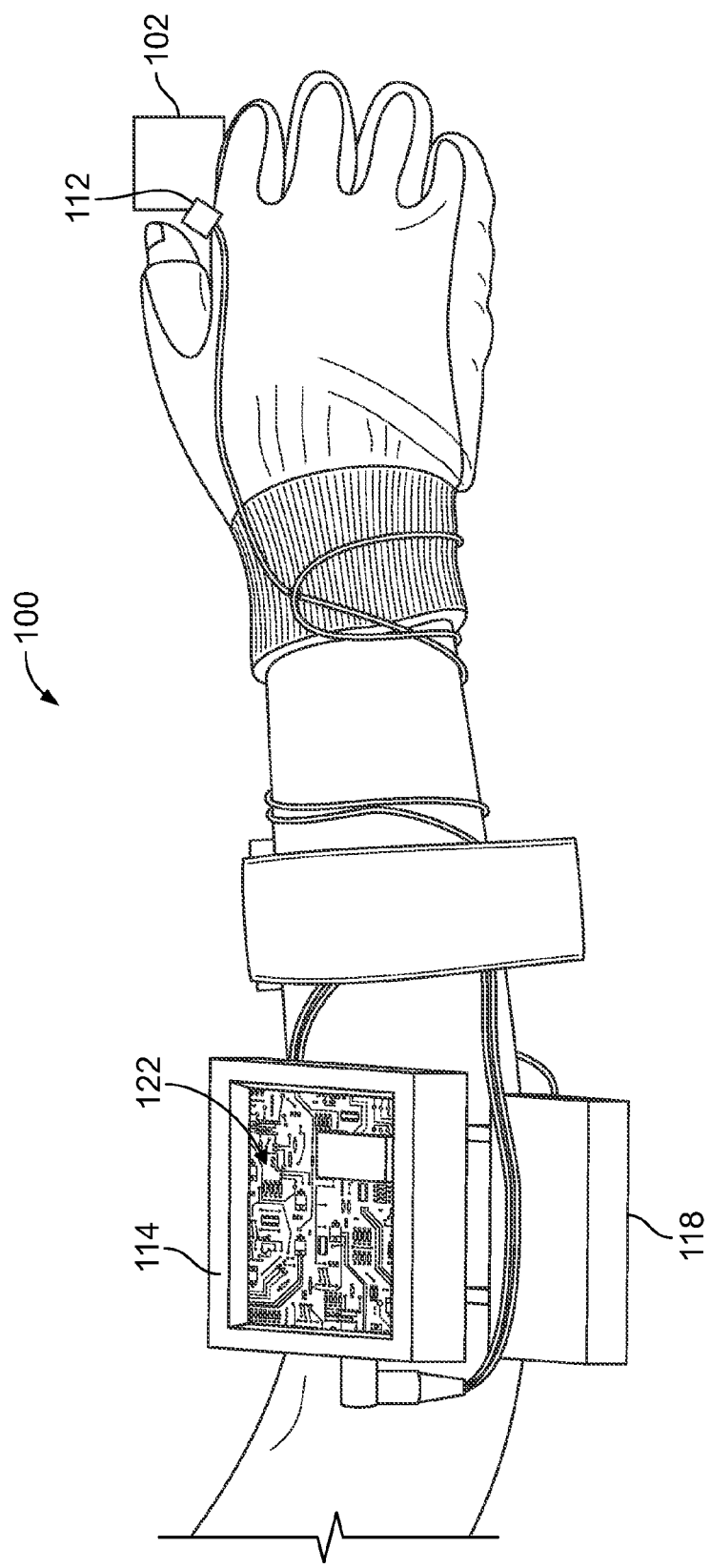
FIG. 4 is a perspective view of the mating assurance system formed in accordance with an exemplary embodiment.

FIG. 4 is a perspective view of the mating assurance system 100 formed in accordance with an exemplary embodiment. The mating assurance system 100 provides audible verification of mating to an assembler to confirm that the electrical connector 102 is properly mated to the electrical connector 104. The mating assurance system 100 detects an audible sound when the electrical connector 102 is mated using the audible sensor 112. The audible sensor 112 is a microphone provided at or near the base of the index finger of the assembler. The audible sensor 112 may be located at other locations in alternative embodiments. The audible sensor 112 may be integrated into or strapped onto the glove.

The audible sensor 112 is electrically connected to the controller 114. The controller 114 is strapped to the user's wrist. The controller 114 includes the display 122 for providing feedback to the user. The controller processes the audio signals from the audible sensor 112 and provides feedback, such as via LEDs on the display 122. The controller 114 transmits RF signals to the host controller 116 (shown in FIG. 1) via the communicator 118.

To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like) or multiple pieces of hardware. Similarly, the programs may be stand-alone programs, may be incorporated as subroutines in an operating system, may be functions in an installed software package, and the like. It should be understood that the various embodiments are not limited to the arrangements and instrumentality shown in the drawings.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A connector mating assurance system comprising:
a user-worn sensor unit configured to be worn on or near a user's hand, the sensor unit having an audible sensor configured to be located in a vicinity of a mating zone for electrical connectors, the audible sensor configured to detect an audible sound when the electrical connectors are mated; and
a user-worn controller connected to the audible sensor, the controller receiving audio signals from the audible sensor, the controller processing the audio signals to determine a connector mating status, the controller providing feedback to the user relating to the connector mating status.

2. The connector mating assurance system of claim 1, wherein the controller is configured to be worn on or near a user's wrist.

3. The connector mating assurance system of claim 1, wherein the user-worn controller includes a processor analyzing the audio signals to determine the connector mating status.

4. The connector mating assurance system of claim 1, wherein the controller determines the connector mating status based on the audible sound that occurs when a latch of one electrical connector latches to the corresponding other electrical connector.

5. The connector mating assurance system of claim 1, wherein the controller provides visual feedback to the user.

6. The connector mating assurance system of claim 1, wherein the controller provides haptic feedback to the user.

7. The connector mating assurance system of claim 1, wherein the controller compares the audio signal to one or more templates to determine the connector mating status.

8. The connector mating assurance system of claim 1, wherein the user-worn controller includes a template module storing audio signature templates, the controller comparing the audio signals to the audio signature templates to determine the connector mating status.

9. The connector mating assurance system of claim 1, wherein the controller is calibrated by determining an audio signature for the electrical connector during mating, the controller processing the audio signals by comparing the audio signals to the audio signature to determine the connector mating status.

10. The connector mating assurance system of claim 1, wherein the user-worn controller includes a communicator configured to transmit RF signals to a host controller, the RF signals relating to the audio signals.

11. The connector mating assurance system of claim 10, wherein the user-worn controller transmits the connector mating status to the host controller.

12. The connector mating assurance system of claim 10, wherein the user-worn controller wirelessly transmits the audio signals to the host controller.

13. The connector mating assurance system of claim 10, wherein the user-worn controller identifies a positive connector mating status as the audio signals associated with the electrical connector being properly mated, the user-worn controller transmitting the audio signals corresponding to a predetermined period of time before the positive connector mating status, the audio signals corresponding to the period of time at the positive connector mating status, and the audio signals corresponding to a predetermined period of time after the positive connector mating status.

14. The connector mating assurance system of claim 10, wherein the host controller includes a validation module analyzing the RF signals to validate the connector mating status, the host controller transmitting a validation signal back to the user-worn controller.

15. A connector mating assurance system comprising:
a user-worn sensor unit configured to be worn on or near a user's hand, the sensor unit having an audible sensor configured to be located in a vicinity of a mating zone for electrical connectors, the audible sensor configured to detect an audible sound when the electrical connectors are mated;
a user-worn controller connected to the audible sensor, the user-worn controller receiving audio signals from the audible sensor, the user-worn controller processing the audio signals to determine a connector mating status, the user-worn controller providing feedback to the user relating to the connector mating status, the user-worn controller having a communicator configured to transmit RF signals relating to the audio signals; and
a host controller remote from the user-worn controller, the host controller receiving the RF signals from the communicator of the user-worn controller.

16. A method of detecting electrical connector mating, the method comprising:
positioning a user-worn audible sensor on or near a user's hand;
positioning the audible sensor in a vicinity of a mating zone for an electrical connector;
detecting an audible sound with the audible sensor when the electrical connectors are mated;

positioning a user-worn controller on the user;

sending audio signals based on the audible sound from the audible sensor to the user-worn controller;

processing the audio signals at the user-worn controller to determine a connector mating status; and providing feedback to the user based on the connector mating status.

17. The method of claim 16, further comprising transmitting RF signals relating to the audio signals to a host controller remote from the user-worn controller.

18. The method of claim 17, wherein said transmitting RF signals comprises transmitting less than all of the audio signals to the host controller.

19. The method of claim 17, wherein said transmitting RF signals comprises transmitting only the audio signals in the immediate time vicinity of identification of a positive connector mating status to the host controller.

20. The method of claim 16, wherein said providing feedback comprises at least one of providing visual feedback and providing haptic feedback.

\* \* \* \* \*